Sept. 15, 1970 G. T. HOLMES III, ET AL 3,529,259
DISCRIMINATOR SYSTEM UTILIZING A SINGLE MODE CAVITY RESONATOR
Filed May 21, 1968
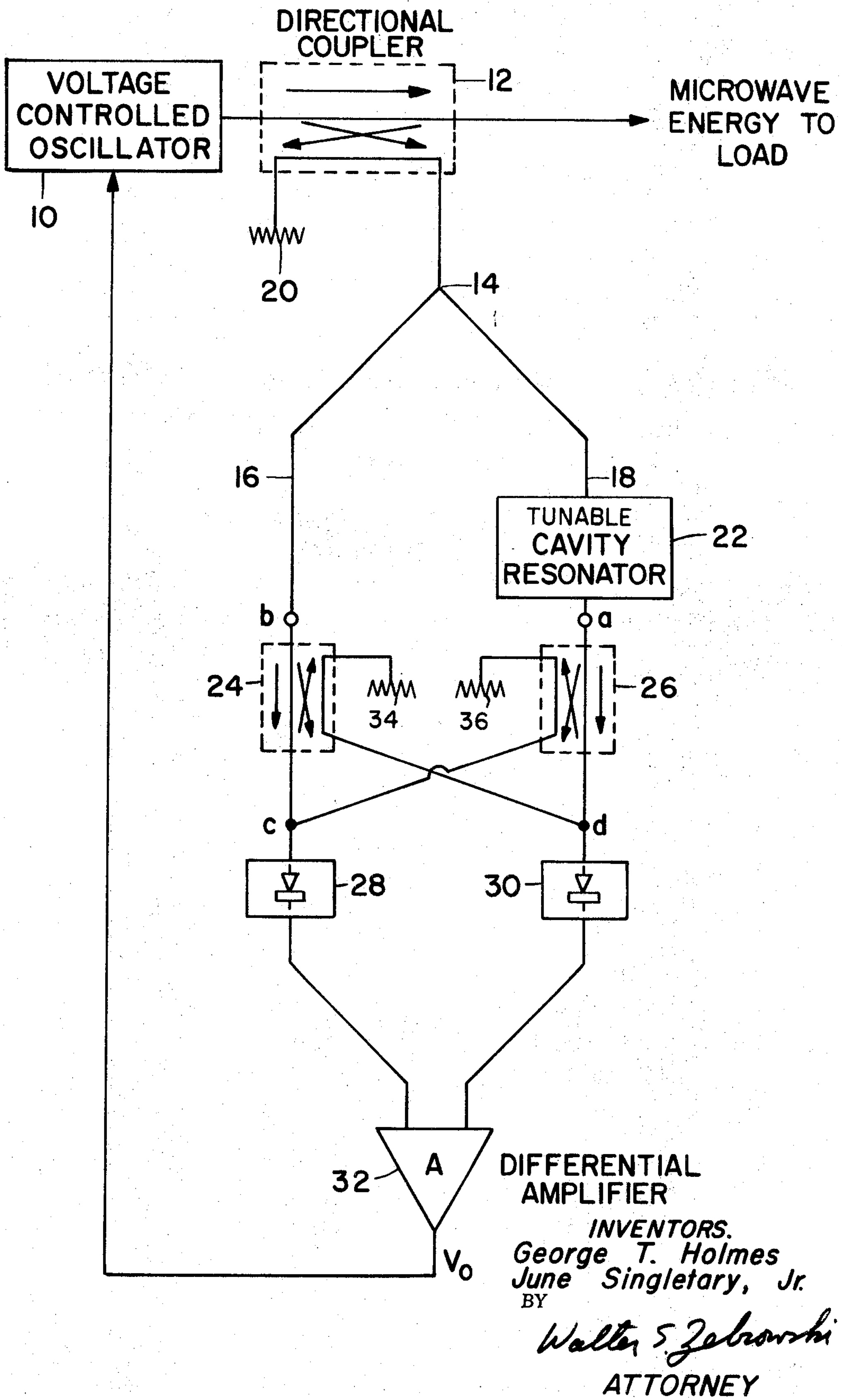
INVENTORS.
George T. Holmes
June Singletary, Jr.
BY
Walter S. Zebrowski
ATTORNEY United States Patent Office 3,529,259
Patented Sept. 15, 1970

3,529,259

DISCRIMINATOR SYSTEM UTILIZING A SINGLE MODE CAVITY RESONATOR

George T. Holmes III, and June Singletary, Jr., Raleigh, N.C., assignors to Corning Glass Works, Corning, N.Y., a corporation of New York Filed May 21, 1968, Ser. No. 730,856
Int. Cl. H03b 3/04
U.S. Cl. 331—9 5 Claims

ABSTRACT OF THE DISCLOSURE

A discriminator circuit for VHF and UHF signal generating systems for stabilizing the frequency thereof. A single mode cavity resonator is employed as a frequency standard and may be tunable if desired. The use of a single mode resonator permits resonator tuning over a wide range of frequencies. The discriminator samples a portion of the energy generated by a voltage controlled oscillator and compares its frequency with the resonant frequency of the resonator. A difference therebetween produces a DC output signal from a differential amplifier which is fed back to the frequency control electrode of the oscillator to reduce the frequency difference.

BACKGROUND OF THE INVENTION

The need for a thermally stable and easily tunable frequency control circuit for a microwave energy source has long been felt in the prior art.

In one usual manner of providing microwave energy, a crystal controlled oscillator is employed to generate a stable low frequency fundamental RF signal. This signal is then amplified to a suitable level as desired and fed to one or more series connected frequency mutiplier stages to produce a microwave output signal at the desired frequency. However, since most crystals are ordinarily limited to mechanical oscillation at a low megahertz frequency, an efficient multiplier system requires numerous stages in order to produce a microwave signal of the desired frequency. Consequently, a number of unwanted harmonics of the fundamental signal are generated, often requiring considerable filtering for adequate suppression.

Another objection to such a microwave generation system is the difficulty encountered in tuning the system to provide a range of microwave output signals. Though the fundamental output signal of the oscillator may be changed as desired by substituting different crystals and and retuning the oscillator tank circuit, all tuned circuits of the succeeding multiplier stages must also be retuned. Since a large number of multiplier stages is likely to be involved, this usually presents a formidable alignment problem.

To avoid the aforementioned difficuties it is desirable to utilize a microwave energy source which generates a fundamental signal directly at the desired frequency. Such a system can be made easily tunable in frequency through manipulation of a single control. Further, such a system does not generate troublesome harmonics of high intensity which require elaborate filtration.

One such microwave generator is the well known voltage controlled oscillator (VCO) which can generate a signal whose frequency is determined by the magnitude of DC bias voltage applied to its frequency control electrode. However, without some manner of frequency error feedback the VCO is inherently unstable in frequency due to sensitivity of the oscillator to ambient and internal temperatures, instability of the bias voltage applied to the frequency control electrode, and the like.

To eliminate the aforementioned difficulties with VCO stability, frequency control and stabilization with a microwave discriminator system utilizing a thermally stable dual or orthogonal mode resonator has been employed in the prior art. The resonator of such a system requires an input port through which to excite the two modes (or orthogonal polarizations as the case may be), and a separate output port coupled to each mode. The cavity of the resonator must be so designed that each mode or polarization resonates the cavity. Further, the modes must be so selected that for frequencies below resonance, one mode couples more strongly to its output port than the other, while for frequencies above resonance, the other mode couples most strongly to its output port. The signals from each output port are separately rectified and fed to a differential amplifier where the rectified signal difference is amplified and thereafter fed back to the frequency control electrode of the VCO. The polarity of the feedback signal applied to the VCO is such that the difference between the two signals presented to the differential amplifier is minimized.

One difficulty encountered with this type of discriminator system is that the dual mode resonator must be excited in two different modes. For this reason the dual mode resonator is inherently a three-port device, having one input and two output ports. Further, the input port must be carefully adjusted for equal excitation of both modes in the cavity at resonance. Also, both output ports must be carefully adjusted to present output signals of equal magnitude at resonance. In addition, both output ports must be adjusted such that there is no cross-coupling of modes between the two. Such adjustments are quite delicate and are often achieved only after elaborate alignment procedures.

Another difficulty encountered with dual mode discriminator systems is that the resonator must be so designed and constructed that two and only two modes or polarizations are present in the cavity. Such a requirement limits the frequency tuning range of the system.

Further, as will readily be appreciated by those skilled in the art, when employing tunable resonators in microwave circuitry it is desirable to utilize a resonator capable of excitation in either the $TE_{01}$ or the TEM mode. The $TE_{01}$ mode, because it has no end wall-to-side wall currents within the cavity, is particularly adaptable to tuning with a simple and easily adjustable cavity end plate.

Unfortunately, the dual mode resonator is not adaptable to either of the aforementioned modes solely, because it must be excited in at least one non-$TE_{01}$ mode, thus significantly complicating the use of movable cavity end plate tuning. Moreover, such a resonator cannot be excited in the TEM mode under any circumstances. As a result the dual mode resonator must be tuned in an elaborate manner through the use of a choke joint.

SUMMARY OF THE INVENTION

It is therefore an object of the instant invention to provide a microwave discriminator system which utilizes a readily tunable cavity resonator for frequency control of a microwave energy source.

It is a further object of the instant invention to provide a microwave discriminator system having higher frequency stability than those previously used in the prior art.

It is yet another object of the instant invention to provide a microwave discriminator system which utilizes either a fixed frequency or tunable resonator of simple construction.

It is still another object of the instant invention to provide a microwave discriminator system which utilizes a $TE_{01}$ or TEM mode resonator.

It is also an object of the instant invention to provide a microwave discriminator system which utilizes a resonator which is tunable in frequency over a wider range than heretofore possible.

Briefly, in accordance with the instant invention, there is provided means for sampling a portion of electromagnetic energy generated by a source. A means for dividing the sampled portion of energy equally between two transmission lines is coupled in receiving relationship to the sampling means. A single mode cavity resonator is responsively coupled to one of said lines. A first directional coupling means is connected in receiving relationship to the resonator to equally divide the output energy thereof between two transmission paths. A second directional coupling means is connected in receiving relationship to the other transmission line to equally divide the energy therein between the two transmission paths. Rectifying means are responsively connected to each of the paths. A means for generating a DC signal corresponding to the difference in magnitude between the energies in the paths is responsively connected to the rectifying means. The DC signal is operatively associated with the source to control the frequency thereof.

Additional objects, features, and advantages of the instant invention will become apparent to those skilled in the art from the following detailed description and attached drawing on which, by way of example, only the preferred embodiment of the instant invention is illustrated.

BRIEF DESCIIPTION OF THE DRAWING

The figure shows a schematic diagram of the circuit configuration of a microwave discriminator illustrating an embodiment of the instant invention.

DESCRIPTION OF THE PREFERRED EMBODIMENT

Referring to the figure there is shown a conventional voltage controlled oscillator 10 supplying microwave energy to a load, not shown. A directional coupler 12 samples a small portion of the output energy of the oscillator 10 and couples it through a T section, branch guide 14, or other well known signal splitting device into two separate signals of equal magnitude and phase relationship propagating along a pair of transmission lines 16 and 18, respectively. The term "transmission line" includes wave guides, coaxial cables, wires, and the like. In the event of a load mismatch with the output signal of the oscillator 10, such portion of the energy reflected from the load, not shown, back through the main channel of the coupler 12, which may be coupled into the secondary channel thereof, is dissipated in a resistor or termination 20.

A cavity resonator 22 of either the transmission or absorption type and preferably operating in either a $TE_{01}$ or TEM mode is coupled in receiving relationship to the energy in line 18. The resonant frequency of the resonator 22 is selected as desired. The output signal frequency of the oscillator 10 will be stabilized at the resonant frequency of the resonator 22 due to the control action of the discriminator circuitry as later explained. The resonator 22 produces a phase change between the signals at points *a* and *b* when the output signal frequency of the oscillator 10 shifts away from the resonant frequency of the resonator 22, i.e., a positive phase shift of the signal in the line 18 for oscillator frequencies on one side of resonance, and a negative phase shift for oscillator frequencies on the other side of resonance. Also, due to the response characteristics of the resonator 22, signals of unequal magnitude reach the points *b* and *a* of the lines 16 and 18, respectively.

Directional couplers 24 and 26, connected to receive the signal energies in the lines 16 and 18 at the points *b* and *a* respectively, compensate for the difference in signal magnitudes caused by the resonator 22. In the event energy is reflected back into directional couplers 24 and 26 from the output transmission paths for any reason, such as an impedance mismatch in directional couplers 24 and 26, an impedance mismatch in signal detectors 28 and 30, or an impedance mismatch in the transmission lines 16 and 18 between the couplers and detectors, such energy will be dissipated in resistors 34 and 36 so that the reflected energy does not reach cavity resonator 22 or directional coupler 12, thus enhancing the overall stability and sensitivity of the system. The power output of each coupler 24 and 26 is equally divided between the points *c* and *d* of the lines 16 and 18. The signals at the points *c* and *d* of the lines 16 and 18 respectively are thereafter rectified by diode detectors 28 and 30.

The action of the couplers 24 and 26 is to produce signals at the detectors 28 and 30 which are equal in magnitude at the resonant frequency of the resonator 22, but unequal in magnitude for frequencies on either side of resonance. The detectors 28 and 30 rectify the two signals reaching the points *c* and *d* and supply them to a conventional differential amplifier 32. The amplified difference between the two detected signals is represented by a DC output potential $V_0$ of the amplifier 32, which potential $V_0$ is proportional to the difference between the output signal frequency of the oscillator 10 and the resonant frequency of the resonator 22. When the oscillator 10 has an output signal frequency equal to the resonant frequency of the resonator 22 the potential $V_0$ is zero and the discriminator provides no frequency corrective action. In all other cases the sign of $V_0$ is such that the output frequency of the oscillator 10 is shifted toward the resonant frequency of the resonator 22.

Although the instant invention has been described with respect to specific details of a certain embodiment thereof, it is not intended that such details limit the scope of the instant invention except insofar as set forth in the following claims.

We claim:

1. A discriminator system for stabilizing the frequency of a source of electromagnetic energy comprising means for sampling a portion of said energy, means for equally dividing said portion between two transmission lines, a cavity resonator responsively coupled to one of said lines, first directional coupling means connected in receiving relationship to said resonator for equally dividing the output energy thereof between two transmission paths, a resistor responsively connected to said first directional coupler for dissipating energy reflected back into the coupler from the output transmission path, second directional coupling means connected in receiving relationship to the other of said lines for equally dividing the energy therein between said two paths, a resistor responsively connected to said second directional coupler for dissipating energy reflected back into the coupler from the output transmission path, rectifying means responsively connected to each of said two paths, and means responsively connected to said rectifying means for generating a DC signal corresponding to the difference in magnitude between the energies in said two paths, said signal being operatively associated with said source to control the frequency thereof.

2. The system of claim 1 wherein the resonant frequency of said resonator is tunable.

3. A discriminator system for stabilizing the frequency of a source of electromagnetic energy comprising a first directional coupler responsively connected to said source for sampling a portion of said energy, a branch guide connected to the secondary channel of said coupler for equally dividing said portion between two transmission lines, a cavity resonator responsively coupled to one of said lines, a second directional coupler responsively coupled to said resonator for equally dividing the output energy thereof between two transmission paths, a resistor responsively connected to said second directional coupler for dissipating energy reflected back into the coupler from the output transmission path, a third directional coupler responsively connected to the other of said lines for equally dividing the energy therein between said two paths, a resistor responsively connected to said third directional coupler for dissipating energy reflected back into the coupler from the output transmission path, a pair of diode detectors respectively connected to each of said two paths for rectifying the energies therein, and a differential amplifier responsively connected to each of said pair of detectors for amplifying the rectified energy difference between said two paths, said amplifier producing a DC output signal the magnitude of which corresponds to the difference between the frequency of said source and the resonant frequency of said resonator, said signal being operatively associated with said source to control the frequency thereof.

4. A discriminator system for electromagnetic energy comprising input terminal means for receiving said energy, means for equally dividing said energy between two transmission lines, a single mode cavity resonator responsively coupled to one of said lines, first directional coupling means connected in receiving relationship to said resonator for equally dividing the output energy thereof between two transmission paths, a resistor responsively connected to said first directional coupler for dissipating energy reflected back into the coupler from the output transmission path, second directional coupling means connected in receiving relationship to the other of said lines for equally dividing the energy therein between said two paths, a resistor responsively connected to said second directional coupler for dissipating energy reflected back into the coupler from the output transmission path, and rectifying means responsively connected to each of said two paths.

5. The discriminator of claim 4 further comprising means responsively connected to said rectifying means for generating a DC signal corresponding to the difference in magnitude between the energies in said two paths.

References Cited

UNITED STATES PATENTS

| | | | |
|---|---|---|---|
| 2,726,333 | 12/1955 | Pritchard | 331—9 |
| 2,905,902 | 9/1959 | Strandberg | 331—9 |

JOHN KOMINSKI, Primary Examiner

U.S. Cl. X.R.

331—12; 333—10